(12) United States Patent
Cha et al.

(10) Patent No.: US 8,154,640 B2
(45) Date of Patent: Apr. 10, 2012

(54) SUB-PIXELS, UNIT PIXELS, IMAGE SENSORS AND METHODS OF OPERATING THE SAME

(75) Inventors: Dae-kil Cha, Suncheon-si (KR); Bok-ki Min, Suwon-si (KR); Young-gu Jin, Yongin-si (KR); Won-joo Kim, Suwon-si (KR); Seung-hoon Lee, Seoul (KR); Yoon-dong Park, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 403 days.

(21) Appl. No.: 12/230,363

(22) Filed: Aug. 28, 2008

(65) Prior Publication Data

US 2009/0251581 A1    Oct. 8, 2009

(30) Foreign Application Priority Data

Apr. 8, 2008  (KR) .................. 10-2008-0032660

(51) Int. Cl.
*H04N 3/14* (2006.01)
*H04N 5/335* (2011.01)
*H01L 31/062* (2012.01)
*H01L 31/113* (2006.01)

(52) U.S. Cl. ......... 348/307; 348/302; 348/308; 257/291
(58) Field of Classification Search .................. 348/294, 348/302, 307–309; 257/291, 293–294; 365/185.14
See application file for complete search history.

(56) References Cited

U.S. PATENT DOCUMENTS

| | | | | |
|---|---|---|---|---|
| 5,587,596 | A | * | 12/1996 | Chi et al. ............... 257/223 |
| 5,808,677 | A | * | 9/1998 | Yonemoto .............. 348/308 |
| 7,113,212 | B2 | * | 9/2006 | Yonemoto et al. ...... 348/302 |
| 2002/0137235 | A1 | * | 9/2002 | Rohlfing ................. 438/11 |
| 2004/0135203 | A1 | * | 7/2004 | Fazan et al. ............ 257/347 |

* cited by examiner

*Primary Examiner* — Daniel M Pasiewicz
(74) *Attorney, Agent, or Firm* — Harness, Dickey & Pierce, P.L.C.

(57) ABSTRACT

An image sensor includes a plurality of unit pixels arranged in an array. Each unit pixel includes a plurality of sub-pixels configured to be irradiated by light having the same wavelength. Each sub-pixel includes a plurality of floating body transistors. Each floating body transistor includes a source region, a drain region, a floating body region between the source region and the drain region, and a gate electrode formed on the floating body region.

15 Claims, 4 Drawing Sheets

UNIT PIXEL

SUB-PIXELS, UNIT PIXELS, IMAGE SENSORS AND METHODS OF OPERATING THE SAME

PRIORITY STATEMENT

This non-provisional U.S. Patent application claims priority under 35 U.S.C. §119 to Korean Patent Application No. 10-2008-0032660, filed on Apr. 8, 2008, in the Korean Intellectual Property Office, the entire contents of which are incorporated herein by reference.

BACKGROUND

Description of the Related Art

A color image sensor is a photoelectric conversion device that transforms detected light into electrical signals. A conventional image sensor includes a plurality of unit pixels arranged in an array on a semiconductor substrate. Each of the unit pixels includes a photodiode and a plurality of transistors. Photodiodes generate optical charges in response to detected external light and store the optical charges. The transistors output electrical signals according to the amount of the generated optical charges.

An example of a conventional image sensor is a complimentary metal oxide semiconductor (CMOS) image sensor. A conventional CMOS image sensor includes a conventional photodiode that receives and stores optical signals. This type of image sensor realizes images by using a control device that controls or processes optical signals. Because the control device may be manufactured using a CMOS manufacturing technique, the manufacturing process of the control device is relatively simple. Moreover, CMOS image sensors may also be manufactured in a single chip together with various signal process devices.

Conventional CMOS image sensors output a voltage in response to an amount of received light. The output voltage is read as digital data by an analog-to-digital converter. To measure charges generated by light, three or four transistors are required, which renders conventional CMOS image sensor structures relatively complex.

SUMMARY

Example embodiments provide sub-pixels, unit pixels, and image sensors in which an intensity of light is output as a binary photo signal in a single cell region. Example embodiments also provide methods of operating sub-pixels, unit pixels and image sensors.

According to at least one example embodiment, an image sensor using binary photo signals may include a plurality of unit pixels arranged in an array. Each unit pixel may include a plurality of sub-pixels capable of being irradiated by light having same or substantially the same wavelength. Each sub-pixel may include a plurality of floating body transistors. Each floating body transistor may include a floating body region between a source region and a drain region, and a gate electrode formed on the floating body region. The floating body region may generate electron-hole pairs in response to received light. The electrons may be discharged through the source region or the drain region.

According to at least one example embodiment, an image sensor using binary photo signals may include a plurality of unit pixels arranged in an array. Each unit pixel may include a plurality of sub-pixels unit pixel may include a plurality of sub-pixels. Each sub-pixel may include a plurality of floating body transistors. Each floating body transistor may include a floating body region arranged between a source region and a drain region. The floating body region may be configured to generate electron-hole pairs in response to received light, discharge the electrons through at least one of the source region and the drain region, and accumulate the holes in the floating body region. The accumulated holes may be indicative of a first current state. The first current state may be representative of a first information type. The floating body region may be further configured to discharge the holes to at least one of the source region and the drain region in response to a voltage applied to at least one of the source region and the drain region to enter a second current state. The second current state may be representative of a second information type.

At least one other example embodiment provides a unit pixel for an image sensor. According to at least this example embodiment, the unit pixel may include a plurality of sub-pixels. Each sub-pixel may include a plurality of floating body transistors. Each floating body transistor may include a floating body region arranged between a source region and a drain region. The floating body region may be configured to generate electron-hole pairs in response to received light, discharge the electrons through at least one of the source region and the drain region, and accumulate the holes in the floating body region. The accumulated holes may be indicative of a first current state. The first current state may be representative of a first information type. The floating body region may be further configured to discharge the holes to at least one of the source region and the drain region in response to a voltage applied to at least one of the source region and the drain region to enter a second current state. The second current state may be representative of a second information type.

At least one other example embodiment provides a sub-pixel of a unit pixel of an image sensor. The sub-pixel may include a plurality of floating body transistors. Each floating body transistor may include a floating body region arranged between a source region and a drain region. The floating body region may be configured to generate electron-hole pairs in response to received light, discharge the electrons through at least one of the source region and the drain region, and accumulate the holes in the floating body region. The accumulated holes may be indicative of a first current state. The first current state may be representative of a first information type. The floating body region may be further configured to discharge the holes to at least one of the source region and the drain region in response to a voltage applied to at least one of the source region and the drain region to enter a second current state. The second current state may be representative of a second information type.

According to at least some example embodiments, each of the floating body transistors may be configured to output a digital signal without the use of an analog-to-digital converter. The first information type may be a first digital value, and the second information type may be a second digital value. The first and second digital values may be different.

According to at least some example embodiments, an image sensor may further include a plurality of gate lines that connect the gate electrodes of the plurality of floating body transistors, a plurality of row lines connecting the drain regions of the plurality of floating body transistors, and a plurality of column lines connecting the source regions of the plurality of floating body transistors. The column lines may be formed perpendicular or substantially perpendicular to the gate lines and the row lines. A current measured from the column lines may be indicative of the first current state or the second current state. The current measured (or flowing) in the first current state may be greater than a current measured (or flowing) in the second current state. The floating body transistors may be formed of a semiconductor on an insulating layer and/or may have a width of between about 50 nm and about 500 nm, inclusive. The gate may be formed of polysilicon, a transparent electrode or similar material.

At least one other example embodiment provides a method of operating an image sensor. According to at least this example embodiment, a charge storing region may be formed in a floating body region by applying a negative voltage to a gate of at least a first of the plurality of floating body transistors. Information may be recorded in at least the first floating body transistor by irradiating light from above the image sensor. Information recorded in at least the first floating body transistor may be read, and the charges accumulated in the floating body region of at least the first floating body region may be removed or discharged.

According to at least some example embodiments, the charge storing region may be formed by applying a positive voltage to the drain region of at least the first floating body transistor. The recorded information may include information "1" recorded by converting the floating body region of at least the first floating body transistor to a first current state.

According to at least some example embodiments, information may be read by applying a first voltage to a row line, detecting a third current from the cell where the column line and the row line cross by scanning the column lines, and determining whether the floating body transistor corresponding to the cell is in the first or second current state based on the third current and a reference current. The floating body transistor corresponding to the cell may be in the first current state if the third current is greater than a reference current. The floating body transistor may be in the second current state if the third current is less than or equal to the reference current.

According to at least some example embodiments, information may be read by applying a positive voltage greater than a threshold voltage of the floating body transistor to one of the plurality of gate lines, detecting a fourth current from the cell where a column line and a row line cross by scanning the column lines, and determining whether a floating body transistor is in the first current state or the second current state based on the fourth current and a reference current. The floating body transistor may be in the first current state if the fourth current is greater than the reference current. The floating body region may be in the second current state if the fourth current is less than or equal to the reference current.

According to at least some example embodiments, charges may be removed by discharging holes accumulated in the floating body region by placing the potential of the floating body region between the potentials of the source region and the drain region. Alternatively, holes accumulated in the floating body region may be discharged to the source region or the drain region by applying a negative voltage to the source region or the drain region.

According to example embodiments, charges may be removed by converting the floating body transistor into the second current state. A detection intensity of light in the sub-pixel may be calculated as a ratio of the floating body transistors read in the first current state to the total number of floating body transistors in the sub-pixel. Each of the forming of the charge storing region, the recording of the information, and the reading of the information may be performed by synchronously by applying a voltage to the source region, the drain region and the gate electrode of at least the first floating body transistor.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS

Figure 1:
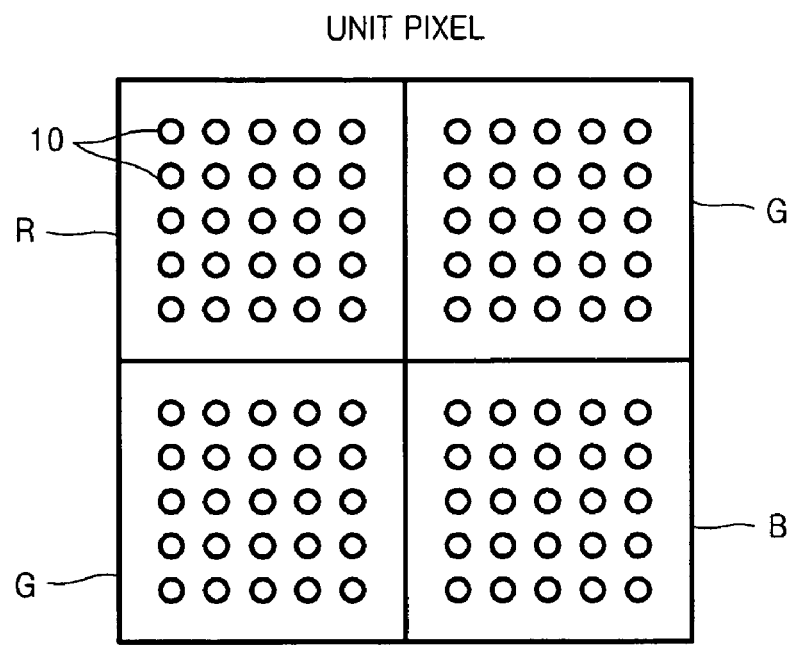
FIG. 1 is a plan view of a unit pixel of an image sensor that uses binary photo signals according to an example embodiment.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

Further, it will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

Further still, it will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present.

Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a plan view of a unit pixel of an image sensor that uses binary photo signals according to an example embodiment.

Referring to FIG. 1, an image sensor may include a plurality of unit pixels arranged in an array. Each of the unit pixels may include a plurality of sub-pixels. The sub-pixels may detect visible light having wavelengths different from each other. Each sub-pixel may correspond to a different color. The sub-pixels may be a red pixel R, a green pixel G, and a blue pixel B. A color filter may be formed on each of the sub-pixels. The color filters may selectively transmit light to be detected by the sub-pixels. Micro lenses may also be formed on the color filters. The micro lenses may serve as focusing lenses. For convenience of drawing, the configuration of the focusing lenses and the color filters is omitted from FIG. 1.

A plurality of floating body transistors 10 and wires (not shown) may be formed in each of the sub-pixels R, G, and B. The wires may connect the floating body transistors 10 in an array shape. The floating body transistors 10 may be formed to have a size between about 50 nm and about 500 nm, inclusive. The floating transistors 10 may provide binary information indicative of whether light is impinging (is irradiated) on the floating transistors 10.

Figure 2:
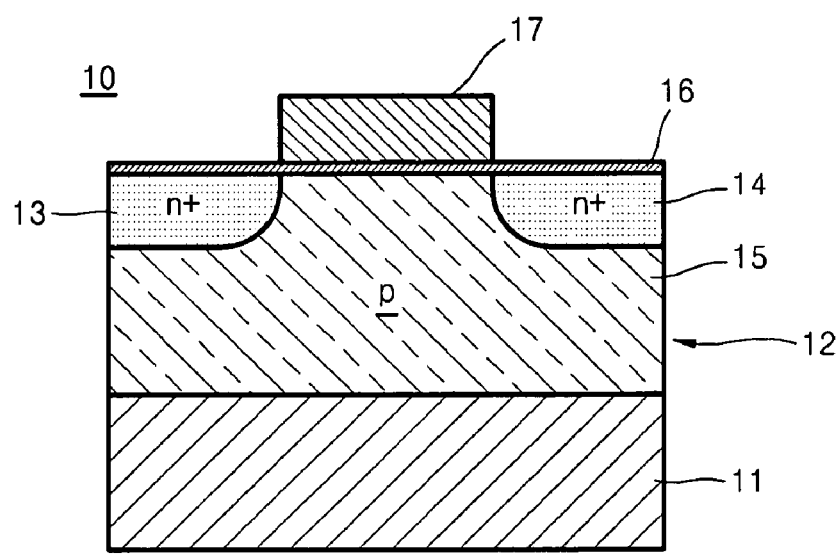
FIG. 2 is a cross-sectional view of a floating body transistor of an image sensor according to an example embodiment.

FIG. 2 is a cross-sectional view of an example embodiment of a floating body transistor 10 shown in FIG. 1.

Referring to FIG. 2, a semiconductor layer 12 may be formed on an insulating layer 11. In one example, the semiconductor layer 12 may be a p-type silicon layer. A source region 13 and a drain region 14 may be formed apart from each other on or within the p-type silicon layer 12. The source region 13 and the drain region 14 may be formed by doping portions of the p-type silicon layer 12 with an n-type dopant. A region of the p-type silicon layer 12 between the source region 13 and the drain region 14 may serve as a floating body region 15. A gate insulating layer 16 and a gate electrode 17 may be stacked on the p-type silicon layer 12. The gate insulating layer 16 may be a silicon oxide or the like.

The gate electrode 17 may be formed of a transparent metal, for example, indium tin oxide (ITO), polysilicon or the like. If the gate electrode 17 is formed of an opaque material such as the polysilicon, the gate electrode 17 may be formed such that a portion of a surface (e.g., an upper surface) of the floating body region 15 is exposed (e.g., not covered) by the gate electrode 17 so that light impinges (e.g., directly impinges) on the floating body region 15. If the gate electrode 17 is formed of polysilicon, the gate electrode 17 may be formed to have a thickness of less than or equal to about 100 nm to reduce (e.g., minimize) the amount of light absorption in the polysilicon. Thus, the floating body region 15 may be formed to receive irradiated light.

A process of recording information in the floating body transistors 10 according to example embodiments will now be described with reference to drawings.

When a given or desired negative voltage, (e.g., between about −1V and about −2V, inclusive) is applied to the gate electrode 17 of the floating body transistor 10, a charge storing region may be formed in the floating body region 15. An electron moving path may be formed by applying a positive voltage (e.g., about 0.5V) to the drain region 14. A given voltage (e.g., a ground voltage) may be applied to the source region 13.

When light is irradiated from above the image sensor, light having a given wavelength, which passes through a micro lens and a color filter, impinges onto the floating body region 15. The impinging light causes electron-holes pairs to form in the floating body region 15. A plurality of electron-hole pairs may be formed in the floating body region 15 through, for example, an avalanche phenomenon caused by a relatively strong electric field. The relatively strong electric field may be caused by a gate voltage resulting from movement of electrons to the drain region 14.

The drain region 14 may emit electrons, while the floating body region 15 accumulates holes. The accumulated holes may reduce an energy barrier, which causes the floating body transistors 10 to enter a state in which current flows relatively smoothly. In this example, the state in which current flows relatively smoothly represents a first information type (e.g., a "1" state), whereas the state of the floating body transistor prior to irradiating the light is defined as a second information type (e.g., a "0" state). These states enable the floating body transistors 10 to provide (e.g., directly provide) binary information according to whether light is irradiated or not, and without the need for an analog-to-digital converter.

A positive voltage may be applied to the drain region 14 to emit electrons through the drain region 14 having a relatively low potential. If light is irradiated when the potential of the source region 13 and the potential of the drain region 14 are equal or substantially equal to each other, electrons may be emitted through both the source region 13 and the drain region 14.

In the above example embodiments of processes of forming a charge storing region, light irradiation, information writing and/or reading, a pulse voltage may be concurrently, simultaneously and/or synchronously applied to the gate electrode 17, the source region 13, and/or the drain region 14. In this example, the starting time, the rising time, the duration time, and the falling time of the pulse voltage may be matched or synchronized to reduce and/or minimize the interference of electrical noise to the amount of charge.

The floating body transistor 10 according to at least this example embodiment may realize a more sensitive photo sensor because photons store a relatively large amount of holes in the floating body region 15 due to the avalanche phenomenon even if a relatively small amount of light is irradiated. For example, if floating body transistors 10 having a relatively small size (e.g., about 100 nm) may be formed in a single sub-pixel having a relatively small area (e.g., about 2 μm width), about 400 photo sensors may be formed in the single sub-pixel. As a result, a single sub-pixel may detect an optical intensity in a range from about 0 to about 400, inclusive, which may increase the optical detection sensitivity.

Moreover, regions for a plurality of transistors required for transmitting an intensity of light incident on a single sub-pixel as single analog information and an analog-to-digital converter per single column line, which are required for the conventional image sensor, may be omitted. As a result, a smaller CMOS image sensor may be realized.

Figure 3:
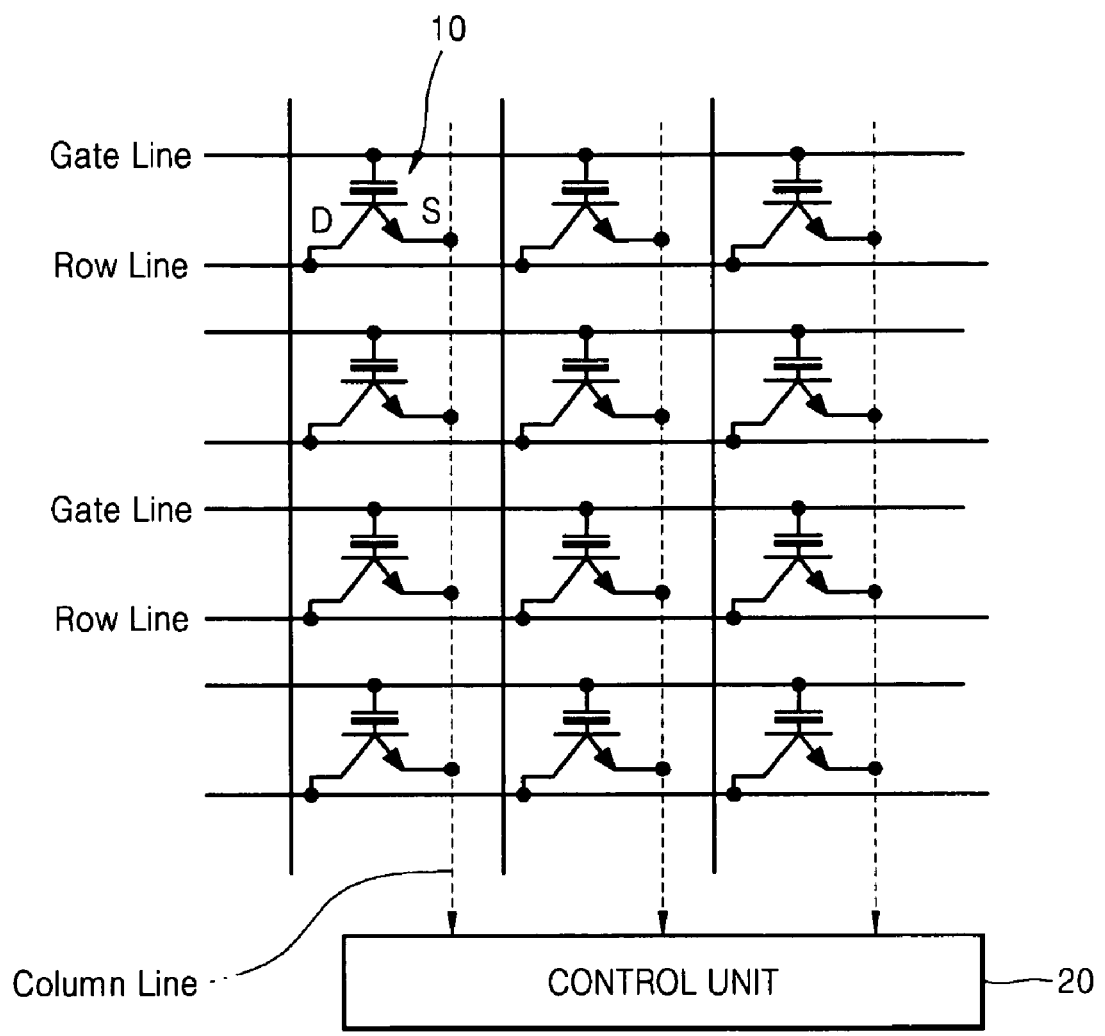
FIG. 3 shows an array of sub-pixels of a unit pixel of an image sensor according to an example embodiment.

FIG. 3 shows an array of sub-pixels of an image sensor according to an example embodiment.

Referring to FIG. 3, floating body transistors 10 may be arranged in an array shape. Each floating body transistor 10 may be a cell. A row line may be connected to drain regions 14 of the floating body transistors 10 belonging to a single row. Source regions 13 may be connected to a column line. A gate line may be connected to gate electrodes 17 in parallel with the row line. Thus, the column line may address a cell crossing the row line, and the column line may address a cell with the gate line.

A method of reading image information of each of the cells in an image sensor according to example embodiment will now be described.

According to at least one example embodiment, a row line may be selected and a given voltage (e.g., about 0.1V) may be applied to the selected row line. A column line, through which a current flows, may be detected by scanning the column lines. If a current flows in the column line, a cell at which the row line and the column line cross is read as being in a "1" state, whereas a cell through which a current does not flow is read as being in a "0" state.

When the above process is repeated, all or substantially all information of cells belonging to the sub-pixel may be read.

A control circuit or unit 20 connected to the column lines may generate a sum by adding input information "1", and calculating the intensity of light of the corresponding sub-pixel region by dividing the sum by the total number of the cells.

Image sensors according to example embodiments may acquire intensity of light as digital information without using an analog-to-digital converter, thus a correct intensity of light may be measured without noise that may occur in transistors for processing signals and the analog-to-digital converter, thereby having increased sensitivity.

Figure 4:
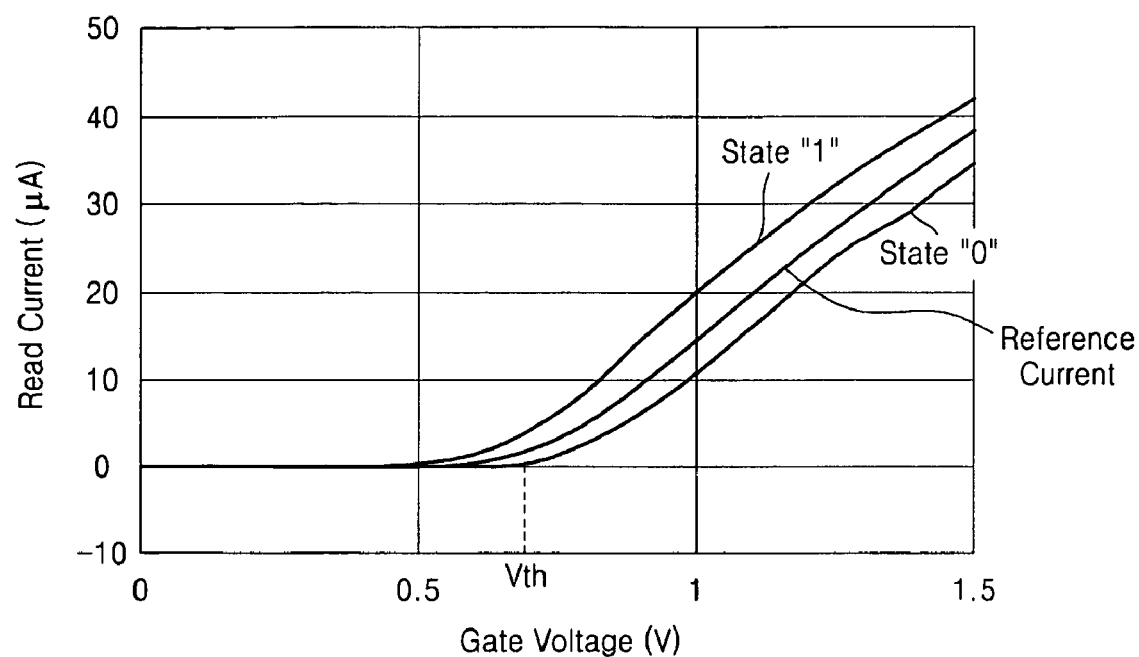
FIG. 4 is a graph for explaining a method of reading information recorded in a floating body transistor according to an example embodiment.

FIG. 4 is a graph for explaining a method of reading information recorded in a floating body transistor according to another example embodiment.

Referring to FIG. 4, holes accumulated in a floating body region 15 may reduce a threshold voltage of the floating body transistor 10. The change of the threshold voltage may be expressed as a change in current. FIG. 4 is an Id-Vg graph according to the change of threshold voltage of the floating body transistor 10 according to example embodiments.

When a given voltage of (e.g., about 1V) greater than a threshold voltage Vth of the floating body transistor 10 is applied to a gate line, if a current measured from the column line is greater than a given reference current, the floating body transistor 10 is read as being in a "1" state. If the measured current is smaller than the given reference current, the floating body transistor 10 is read as being in a "0" state. Accordingly, information of the cell where the gate line and the column line cross may be read relatively accurately.

The control unit 20 connected to the column lines may generate a sum by adding information "1" input from the floating body transistors 10 of a single sub-pixel, and the intensity of light of the corresponding sub-pixel region may be calculated by dividing the sum by the total numbers of floating body transistors 10 of the sub-pixel.

Figure 5:
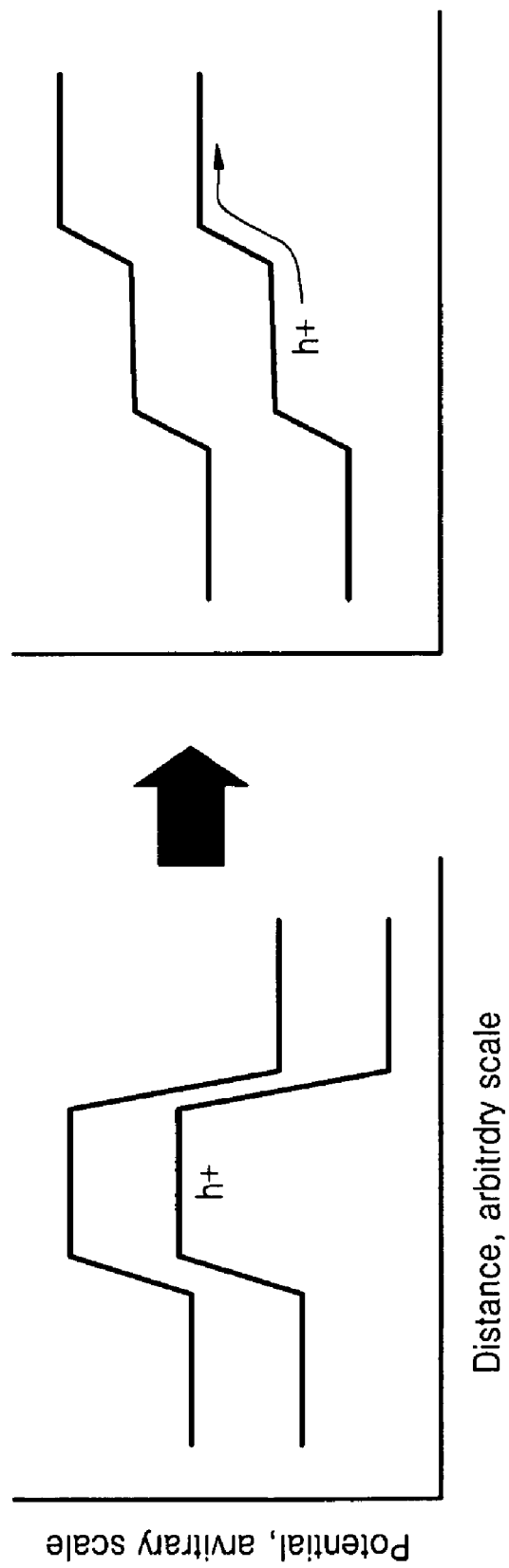
FIG. 5 is an energy band diagram for explaining a method of erasing information recorded in a floating body region according to an example embodiment.

FIG. 5 is an energy band diagram for explaining a method of erasing information recorded in a floating body transistor according to an example embodiment.

Referring to FIG. 5, when holes accumulate in the floating body region 15, if a potential of the drain region 14 is increased higher than that of the floating body region 15 by applying a given or desired negative voltage to the drain region 14, the holes accumulated in the floating body region 15 may be discharged to the drain region 14. When a positive voltage is applied to the drain region 14, the floating body region 15 may return to an original or initial state, for example, a "0" state.

To erase information recorded in a floating body, a negative voltage may be applied to the source region 13 instead of applying a negative voltage to the drain region 14.

Also or alternatively, the potential of the floating body region 15 may be placed between the potentials of the source region 13 and the drain region 14 by applying a given or desired voltage to the gate electrode 17.

Image sensors according to example embodiments need not include a conventional analog-to-digital converter and/or a plurality of transistors required for processing signals because, in the image sensor according to example embodiments, a single floating body transistor may receive light and output (e.g., directly output) a single digital signal.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A sub-pixel of an image sensor, the sub-pixel comprising:
    a plurality of floating body transistors, each floating body transistor including,
        a floating body region arranged between a source region and a drain region in a semiconductor layer on an insulating layer, the floating body region being configured to generate electron-hole pairs in response to received light, discharge the electrons through at least one of the source region and the drain region, and accumulate the holes in the floating body region, the accumulated holes being indicative of a first current state, and the first current state being representative of a first information type, the floating body region being further configured to discharge the holes to at least one of the source region and the drain region in response to a voltage applied to at least one of the source region and the drain region to enter a second current state, the second current state being representative of a second information type; wherein
        the source region and the drain region are formed at only surface portions of the semiconductor layer.

2. The sub-pixel of claim 1, wherein a current flowing in the first current state is greater than a current flowing in the second current state.

3. The sub-pixel of claim 1, wherein each of the floating body transistors is configured to output a digital signal without the use of an analog-to-digital converter.

4. The sub-pixel of claim 1, wherein the first information type is a first digital value, and the second information type is a second digital value, the first and second digital values being different.

5. A unit pixel of an image sensor, the unit pixel comprising:
    a plurality of the sub-pixels of claim 1.

6. The unit pixel of claim 5, wherein a current flowing in the first current state is greater than a current flowing in the second current state.

7. The unit pixel of claim 5, wherein each of the floating body transistors is configured to output a digital signal without the use of an analog-to-digital converter.

8. An image sensor comprising:
a plurality of the unit pixels of claim 5 arranged in an array.

9. The image sensor of claim 8, further comprising:
a plurality of gate lines connecting gate electrodes of the plurality of floating body transistors;
a plurality of row lines connecting the drain regions of the plurality of floating body transistors; and
a plurality of column lines connecting the source regions of the plurality of floating body transistors; wherein
the plurality of column lines are formed perpendicular to the plurality of gate lines and the plurality of row lines, and
the first current state or the second current state is determined based on a current flowing on the column lines.

10. The image sensor of claim 9, wherein a current flowing in the first current state is greater than a current flowing in the second current state.

11. The image sensor of claim 8, wherein the plurality of floating body transistors are formed of a semiconductor material on the insulating layer.

12. The image sensor of claim 8, wherein at least one of the plurality of floating body transistors has a width of between 50 nm and 500 nm, inclusive.

13. The image sensor of claim 8, wherein the gate electrode of at least one of the plurality of floating body transistors is formed of polysilicon or a transparent electrode.

14. The image sensor of claim 8, wherein each of the plurality of floating body transistors is configured to output a digital signal without the use of an analog-to-digital converter.

15. A sub-pixel of an image sensor, the sub-pixel comprising:
a plurality of floating body transistors, each floating body transistor including,
a floating body region arranged between a source region and a drain region in a semiconductor layer on an insulating layer, the floating body region being configured to generate electron-hole pairs in response to received light, discharge the electrons through at least one of the source region and the drain region, and accumulate the holes in the floating body region, the accumulated holes being indicative of a first current state, and the first current state being representative of a first information type, the floating body region being further configured to discharge the holes to at least one of the source region and the drain region in response to a voltage applied to at least one of the source region and the drain region to enter a second current state, the second current state being representative of a second information type, wherein
the source region and the drain region are formed at only surface portions of the semiconductor layer,
a gate insulating layer formed on an entire upper surface of each of the floating body region, the source region and the drain region, and
a gate electrode formed on the gate insulating layer.

* * * * *